United States Patent [19]

Scifres et al.

[11] Patent Number: 4,633,476
[45] Date of Patent: Dec. 30, 1986

[54] SEMICONDUCTOR LASER WITH INTERNAL REFLECTORS AND VERTICAL OUTPUT

[75] Inventors: Donald R. Scifres, San Jose; Gary L. Harnagel, Palo Alto, both of Calif.

[73] Assignee: Spectra Diode Laboratories, Inc., San Jose, Calif.

[21] Appl. No.: 672,297

[22] Filed: Nov. 16, 1984

[51] Int. Cl.$^4$ ............................................. H01S 3/19
[52] U.S. Cl. ...................................... 372/45; 372/50; 372/96; 372/108
[58] Field of Search ...................... 372/50, 96, 92, 45, 372/108, 99

[56] References Cited

U.S. PATENT DOCUMENTS

| | | | |
|---|---|---|---|
| 3,996,492 | 12/1976 | McGroddy | 313/500 |
| 3,996,528 | 12/1976 | Blum et al. | 372/44 |
| 4,163,953 | 8/1979 | Springthorpe et al. | 372/50 |
| 4,178,604 | 12/1979 | Nakamura et al. | 372/96 |
| 4,257,011 | 3/1981 | Nakamura et al. | 331/94.5 |
| 4,302,729 | 11/1981 | Burnham et al. | 331/94.5 |
| 4,337,443 | 6/1982 | Umeda et al. | 372/49 |

OTHER PUBLICATIONS

Springthorpe, A. J., "A Novel Double-Heterostructure p-n-Junction Laser", Appl. Phys. Lett., vol. 31, No. 8, pp. 524–525, Oct. 15, 1977.

Streifer, W., et al., "Current Status of (GaAl) As Diode Lasers", SPIE Proceedings, vol. 269, Integrated Optics, pp. 2–7, 1981.

Holoryak, Jr., N., et al., "Quantum-Well Heterostructure Lasers", IEEE Journal of Quantum Electronics, vol. QE-16, No. 2, pp. 170–186, Feb. 1980.

*Primary Examiner*—James W. Davie
*Attorney, Agent, or Firm*—Thomas Schneck

[57] ABSTRACT

A heterostructure semiconductor laser emitting light in a direction vertical to the horizontal active layer has one or more internal reflectors for feedback. Angled reflectors, in the form of grooves etched at an angle exceeding the angle of total internal reflection through the layers, totally internally reflect light out of the laser. One or more of the following feedback constructions are used separately or in combination to provide low threshold current and frequency selection. Insulating windows may be put on the grooves. A periodic grating on a layer adjacent the active layer provides distributed feedback. A plurality of thin dielectric layers placed next to the active layer reflect light back into the active layer. Two parallel integral feedback facets crossing vertically through the active layer act as planar mirrors.

20 Claims, 6 Drawing Figures

SEMICONDUCTOR LASER WITH INTERNAL REFLECTORS AND VERTICAL OUTPUT

TECHNICAL FIELD

The present invention relates to double-heterojunction semiconductor lasers that emit light perpendicular to the p-n junction plane, and in particular to feedback structures for the active layer of such a laser.

BACKGROUND ART

A typical semiconductor laser has two parallel cleaved faces, forming between them an optical cavity. Due to the difference in refractive indices of the semiconductor and air, the faces form partially reflecting mirrors which act as a feedback mechanism. Light is emitted parallel to the p-n junction through the cleaved faces.

Burnham et al., in U.S. Pat. No. 4,302,729 describe a distributed feedback laser that has periodic corrugations on the top surface of the active layer lying above the p-n junction. These corrugations eliminate the need for cleaved mirror surfaces and have the additional advantage of wavelength selectivity. However, the laser emits light in a direction parallel to the p-n junction making the construction of a two-dimensional array of lasers extremely difficult.

McGroddy, in U.S. Pat. No. 3,996,492 and Springthorpe et al. in U.S. Pat. No. 4,163,953 show lasers that emit light in a direction perpendicular to the active layer. This is accomplished by bending the optical cavity with total internal reflecting surfaces oriented 45° with respect to the active layer. These surfaces are the faces of grooves etched into the laser surface. Light is emitted through a hole etched into the substrate with the base of the hole acting as the partially reflecting feedback means. The drawback of this arrangement is mentioned briefly in Springthorpe, A. J., "A Novel Double-heterostructure p-n-junction Laser," Appl. Phys. Lett. Vol. 31, No. 8, pp 524-5, 15 Oct. 1977. The beam diverges after it is bent out of the plane of the active layer, so only a small fraction of light returns to the junction plane for further amplification. This increases the needed threshold current, reducing efficiency and power output, and causing thermal problems.

DISCLOSURE OF INVENTION

It is the object of the present invention to attain a semiconductor laser where feedback is provided before the light leaves the active layer, and where light is emitted nominally vertical relative to the horizontal plane of the active layer, or at least transverse to that plane.

This object is achieved with a semiconductor laser having greater optical feedback efficiency. This increased reflectivity relative to the prior art is achieved in several structures wherein the active layer of the laser is provided with internal mirrors. Light is then emitted using special grooves etched into the laser surface which form reflecting faces oriented at an angle relative to the active layer which ensures total internal reflection of light striking this surface. Light reaching the end of the active layer is reflected toward the output hole, the base of which may be coated with anti-reflection layers. Feedback is provided in one or more of three ways before light leaves the active layer.

In a first structure, the laser may have a grating with grooves periodically spaced to provide distributed feedback. This gives excellent feedback and low threshold. By choosing the grating period properly, the laser wavelength can be controlled. This can be used, for example, to cause the laser to emit in the Nd-YAG absorption band for YAG laser optical pumping. The grating is easily produced using MO-CVD, MBE, LPE and other growth techniques.

In a second structure, a feedback means is produced by growing epitaxial layers of GaAlAs and equivalents with alternating indices of refraction. The layers can be grown using MO-CVD, LPE, MBE, or other crystal growth techniques. The layer thicknesses are chosen to provide high reflectivity. When these layers are grown adjacent to the active layer diverging light reflected from the active layer has far less distance over which to spread and the reflective beam better overlaps the active layer providing higher reflectivity. The resulting laser has a lower threshold than in the prior art and is wavelength selective.

In a third structure, internal feedback is provided by integral reflector facets which define the laser region. These facets reflect a portion of the light back into the laser region for feedback purposes and pass the remainder of the light to adjacent regions. Light entering the adjacent regions is amplified and then deflected out of the plane of the active layer by the groove facets discussed previously. The integral nature of the laser, amplifier and deflector regions ensure that the total structure stays in exact alignment. The feedback facets can be formed in two ways. One method is to generate microcleaves in the wafer which run transverse to the laser stripes. The microcleaves act as mirrors, producing a central laser region and two outer amplifier sections. Another method is to etch vertical trenches into the wafer, also transverse to the stripes. With the proper etching technique, the walls of the trench can be made vertical and smooth to enhance the amount of light reflected back into the laser region. All sections are electrically pumped, although the amplifier sections need not be pumped with the same current density as the lasing section. Reflective feedback in the lasing region can be made high or low depending on the separation between the laser region and the amplifier region. Typically, the separation will be less than one-half the wavelength of light being produced by the laser, although larger spacings can be used.

Further structures can be produced by various combinations of the three feedback means shown in these embodiments. The active layer may be replaced by several layers to form a quantum well. Semi-insulating GaAlAs windows can be put on the groove faces so that solder that attaches the wafer to a heat sink does not short out the p-n junction if solder leaks into the groove.

An advantage of these embodiments is that multiple semiconductor lasers can be fabricated using large scale integration (LSI) process technology. An array of devices on an LSI substrate will have higher output power than previously available individual discrete devices. Also, the alignment problems of forming an array out of individual lasers can be avoided.

BEST MODE FOR CARRYING OUT THE INVENTION

Figure 1:
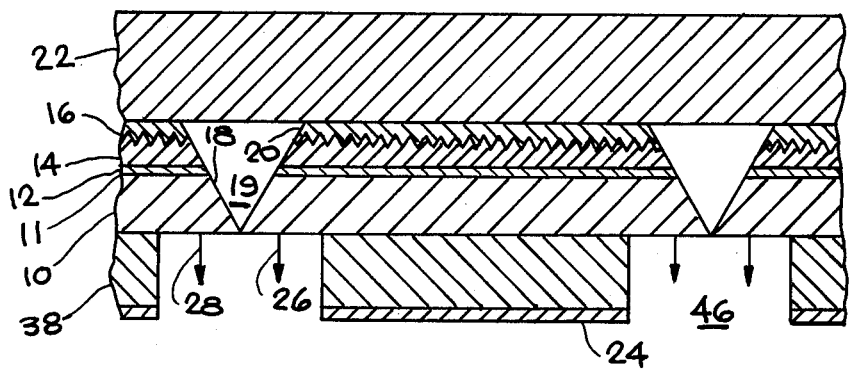
FIG. 1 is a side sectional view showing a first embodiment of a semiconductor laser in accord with the present invention.

With reference to FIG. 1, a semiconductor laser has a planar active layer 12 sandwiched between two n-type semiconductor planar layers 10 and 38, and two p-type semiconductor planar layers 14 and 16. The material of layer 14 is selected for its electrical properties relative to active layer 12, i.e. capable of forming a good p-n junction. The material of layer 16 is selected for its bonding compatibility relative to semiconductor layer 14 and metal contact layer 22. The material of substrate layer 38 is selected for its bonding compatibility relative to semiconductor layer 10 and metal contact layer 24. The active layer 12 may be either n-type or preferably p-type semiconductor. The semiconductor materials are preferably GaAs and $Ga_{0.6}Al_{0.4}As$, although other III-V semiconductors, such as InP, and InGaAsP, can be used. The active layer 12 is GaAs, while the neighboring confining layers, 10 and 14, are $Ga_{0.6}Al_{0.4}As$. The aluminum increases the band gap of the material and decreases the index of refraction, thus confining the electrons injected across the p-n junction 11 to the active layer 12 and allowing the active layer 12 to act as a waveguide, confining light to the active layer. In addition, lateral waveguide means, confining light to a beam, may be included. Various types of layers with lateral waveguides are discussed in depth in SPIE, Proceedings, Vol. 269 Integrated Optics, W. Streifer et al., "Current Status of (GaAl) As Diode Layers", Feb. 10-11, 1981. The active layer may be replaced by several layers forming a quantum well. Quantum well formation is discussed in Nick Holoryak et al., "Quantum-Well Hetero-structure Lasers", IEEE Journal of Quantum Electronics, vol. QE-16, No. 2, pp. 170-186, Feb. 1980.

A V-shaped groove 19 is etched into the layers from the p side. The inclined surface 18 of the groove is preferably oriented at an angle which exceeds the angle of total internal reflection with respect to the p-n junction plane 11, an angle of about 45 degrees. In practice, it is difficult to achieve the precise angle desired, so other angles in the range of 30-60 degrees, or more, will also work. Light guided along the active layer 12 strikes the mirror-like surface 18 and is deflected out of the junction plane 11 toward the hole 28 etched in the substrate layer 38 beneath the groove where the light 26 is emitted. Metal contacts 24 and 22 deposited on opposite sides of the structure, provide a means for electrically pumping the laser. Contact 22 may also act as a heat sink, or be bonded to a heat sink not shown.

Feedback is provided by grating 20 which may be chemically etched into layer 14 using photolithography, or alternatively etched on layer 10. The grating edges 21 are spaced so as to provide distributed feedback. The grating period $T = \lambda q/2n$ where $\lambda$ is the wavelength of the light, q is an integer 1, 2, 3, ..., and n is the equivalent refractive index of the material. So for refractive index 3.6, and wavelength 8700Å, the spacing is 0.12 microns or a multiple thereof. The grating is wavelength selective with only a particular wavelength being amplified in the active layer 12. This is particularly useful for optical pumping of Nd-YAG lasers, where we select for amplification the wavelength of the YAG laser's absorption band.

Figure 2:
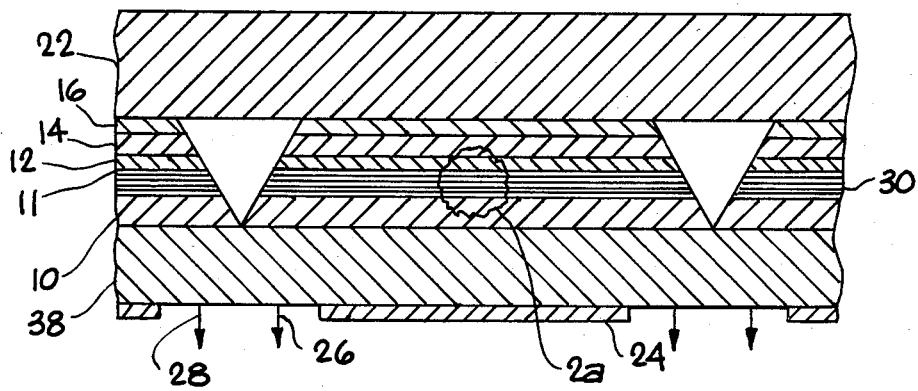
FIG. 2 is a side sectional view showing a second embodiment of a semiconductor laser in accord with the present invention.
Figure 2A:
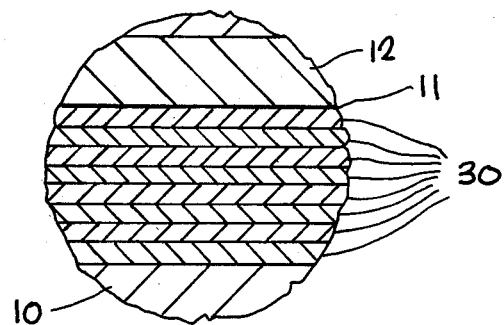
FIG. 2a is an enlarged detail view of a stack of planar horizontal dielectric layers shown inside the circle 2a is FIG. 2.

In FIGS. 2 and 2a, a second embodiment of the invention, a stack of planar horizontal dielectric layers 30 is disposed immediately below the active layer. These layers are grown using MO-CVD, LPE, MPE or other crystal growth techniques between layer 10 and active layer 12. The layers 30 are n-type semiconductor materials having alternating greater and lesser indices of refraction. For example, layers of $Ga_{0.2}Al_{0.8}As$ and $Ga_{0.85}Al_{0.15}As$ are grown to produce a reflectivity of about 0.4% per interface, resulting in an overall reflectivity of over 10% for ten layers. The thicknesses of the layers 30 are $W_{A,B} = \lambda q/4N_{A,B}$, where $\lambda$ is the wavelength, q is an odd integer 1, 3, 5, ..., $N_A$ is the index of refraction of layer A, and $N_B$ is the index of refraction of layer B. Thus, this embodiment is also wavelength selective. Light striking the groove face 18 is reflected into the layers 30 which reflect it back into the active layer 12. This embodiment results in a higher effective reflectivity and in lower thresholds than the prior art, because light has less distance over which to diverge. Therefore, upon reflection by the layers 30, the light overlaps the active layer better. In this embodiment, holes are absent from the substrate 38. This is possible for transparent substrates such as InP, and is an option for any of the internal feedback structures.

Figure 3:
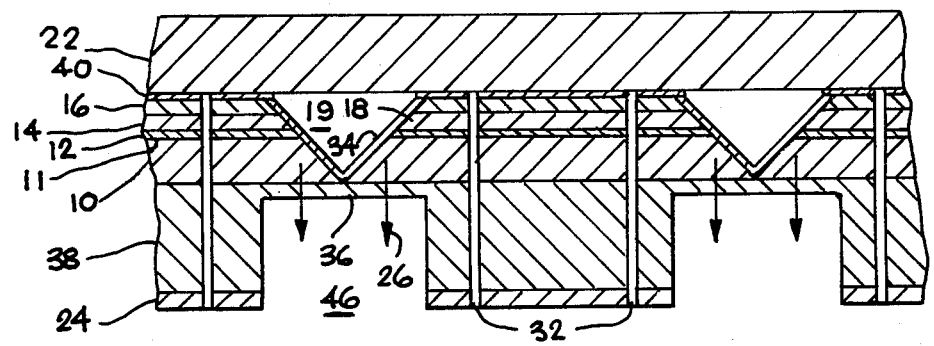
FIG. 3 is a side sectional view showing a third embodiment of a semiconductor laser in accord with the present invention with microcleaves.
Figure 4:
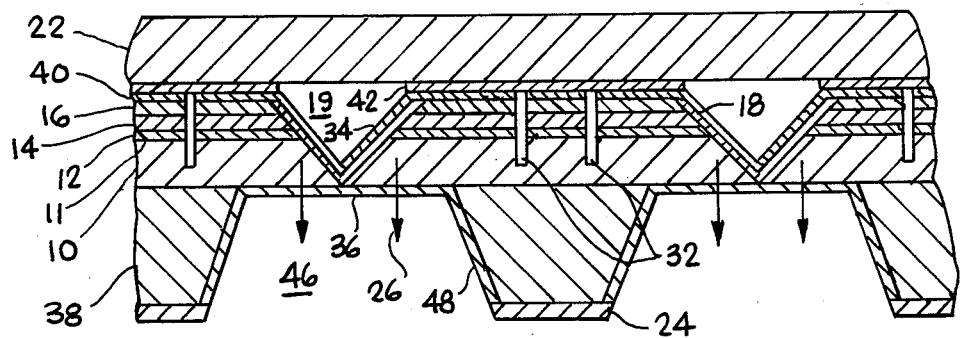
FIG. 4 is a variant of the embodiment shown in FIG. 3.
Figure 5:
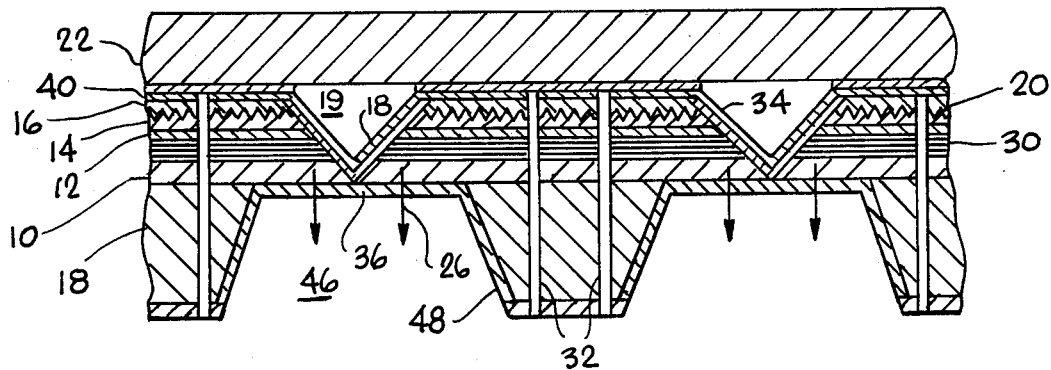
FIG. 5 is a side section view showing a fourth embodiment of the present invention, combining features of the first, second and third embodiments.

In reference to FIGS. 3, 4, and 5, after the grooved wafer is bonded to the heat sink 22, feedback facets 32 are physically broken into the laser by flexing of the substrate while maintaining the alignment of the active layer 12. The facets 32 act as mirrors to define a central laser cavity 42 and two side amplifiers 43 and 44. All three sections are pumped, but the amplifiers 43 and 44 need not be pumped with the same current density as the laser cavity 42. Because feedback in the active layer can be high, lasers with integral facets can have low threshold.

An alternative approach, shown in FIG. 4, is to etch vertical trenches 33 into the grooved wafer surface before it has been bonded to a heat sink. The depth of the trench must extend through the active layer and into the n-type guide layer on the substrate. Insulating windows 34 are added to the grooves 19. The windows are made of transparent insulating materials such as fused $SiO_2$ or BeO. Holes 46 are etched through a bottom n-type substrate 38 until it gets to layer 10, then coated with antireflection coatings. This embodiment has both low threshold and wavelength selectivity because of the presence of the grating 20, reflective layers 30 and microcleaves 32. Light is emitted through holes 46 in the substrate 38 after being reflected perpendicular to the active layer by mirror-like faces in grooves 19. The holes may have tapered sides 48 as shown in FIGS. 4 and 5. Alternatively, if the substrate is transparent to laser radiation, no holes are needed and light is emitted directly through the substrate. InP is one kind of transparent semiconductor. The metallized p-layer 40 may either stop at the grooves as in FIG. 3, or if windows are present, may be in the grooves as in FIGS. 4 and 5. In FIGS. 4 and 5, solder 42 binds the wafer to the heat sink 22. As in FIG. 1, the embodiment in FIG. 5 has a periodic grating 20 chemically etched in the layer 14 using photolithography. The grating edges 21 are spaced so as to provide distributed feedback. The grating period $T=\lambda q/2n$ where $\lambda$ is the wavelength selected, q is an integer, and n is the index of refraction of the material. So for refractive index 3.6 and equivalent wavelength 8700Å, the spacing is 0.12 microns or a multiple thereof. The embodiment in FIG. 5 also has a stack of planar dielectric layers 30 disposed immediately below the active layer. These layers are grown using MOCVD, LPE, MPE or other crystal growth techniques between layer 10 and active layer 12. MOCVD is discussed in an article entitled "Metalorganic Chemical Vapor Deposition of III-V Semiconductors" by R. D. Dupuis in Science, 226, No. 4675, p 623–629, p. 1984. The layers 30 are n-type semiconductor materials having alterations greater and lesser indices of refraction. For example, layers of $Ga_{0.2}Al_{0.8}As$ and $Ga_{0.85}Al_{0.15}As$ are grown to produce a reflectivity of about 0.4% per interface, resulting in an overall reflectivity of over 10% for ten layers. The thicknesses of layers 30 are $W_{A,B}=\lambda q/N_{A,B}$ where $\lambda$ is the wavelength, q is an integer, $N_A$ is the index of refraction of layer A and $N_B$ is the index of refraction of layer B. Light striking the groove face 18 is reflected into the layers 30 which reflect it back into the active layer 12.

FIG. 5 shows an embodiment with all three feedback structures, distributed feedback grating 20, reflective layers 30, and integral feedback facets 32. These structures combine to provide improved distributed optical feedback. The active layer described herein is understood to refer to one or more layers acting to form a lasing region.

We claim:

1. A heterostructure semiconductor laser comprising a plurality of layers of semiconductor materials, one or more of said layers forming a horizontally disposed light emitting active layer capable of lasing, said active layer having spaced apart lateral ends, optical feedback means integrated within said laser in internal proximity to said active layer for forming a laser cavity reflecting light in said active layer, mirror-like surfaces forming said spaced apart lateral ends, inclined at an angle greater than the angle of total internal reflection relative to said active layer to deflect a portion of the light from said cavity vertically out of said active layer, and pumping means communicating energy to said active layer for production of laser radiation therein.

2. The semiconductor laser of claim 1, wherein the optical feedback means comprises a periodic grating internal to said layers.

3. The semiconductor laser of claim 1, wherein the optical feedback means comprises some of said layers of semiconductor materials forming a horizontally disposed reflector stack adjacent to said active layer to provide feedback via said mirror-like surfaces and back into said active layer, said layers having alternating greater and lesser indices of refraction and having such thicknesses as to produce the required reflectivity of said stack.

4. The semiconductor laser of claim 1 wherein the optical feedback means comprises two parallel, spaced apart facets extending vertically to and through said active layer, whereby the active layer forms a central lasing cavity between said facets, and two side amplifier sections, each of said amplifier sections being between one of said facets and one of said mirror-like surfaces.

5. The semiconductor laser of claim 1, where the semiconductor layers are selected from GaAs and GaAlAs.

6. The semiconductor laser of claim 1 where the materials are combinations of elements selected from the group consisting of In, Ga, Al, As, P and Sb.

7. The semiconductor laser of claim 1 where the optical feedback means comprises, a periodic grating at said major surface, a plurality of thin layers of semiconductor material forming a reflector stack disposed adjacent to said p-n junction, said layers having alternating greater and lesser indices of refraction and having thicknesses as to maximize the overall reflectivity of said plurality of thin layers, and two spaced apart, parallel facets extending vertically through said active layer.

8. The semiconductor laser of claim 1 where the mirror-like surfaces have an insulating coating.

9. The semiconductor laser of claim 1 wherein one of said planar, semiconductor layers is a substrate layer, said substrate having spaced apart holes proximate to said mirror-like surfaces for emission of light therethrough.

10. The semiconductor laser of claim 9 wherein light emitting surfaces delimited by said holes in said substrate are coated with an antireflection coating.

11. A semiconductor laser comprising, a plurality of planar, semiconductor layers built up consecutively, an intermediate one of said layers being a light emitting active layer, capable of lasing, layers immediately adjacent said active layer on opposite sides thereto, being electron confining layers, said plurality of layers being doped to provide a p-n junction, said plurality of planar layers having spaced apart lateral ends, contact means communicating electrical energy to said active layer by the application of forward bias to said p-n junction, providing a pumping current to said active layer, for the production of lasing radiation, mirror-like surfaces forming said spaced apart lateral ends, inclined at an angle greater than the angle of total internal reflection relative to said active layer whereby lasing light is reflected in a direction transverse to said active layer, and internal optical feedback means proximate to the active layer associated with the active layer for promoting internal reflection in a laser cavity formed therein.

12. The semiconductor laser of claim 11, where the internal optical feedback means comprises a periodic grating on a surface of one of said confining layers for providing distributed feedback.

13. The semiconductor laser of claim 11 where the internal optical feedback means comprises a plurality of thin layers of semiconductor material forming a reflector stack disposed adjacent to said active layer to provide feedback directly to said mirror-like surfaces and back into said active layer, said layers having alternating greater and lesser indices of refraction and having such thicknesses as to maximize the overall reflectivity of said stack.

14. The semiconductor laser of claim 11, where the internal optical feedback means comprises two parallel, spaced apart facets extending perpendicularly to and through said active layer, whereby the active layer forms a central lasing cavity between said facets and two side amplifier sections, each of said amplifier sections being between one of said facets and one of said mirror-like surfaces.

15. The semiconductor laser of claim 11 where the semiconductor layers are selected from GaAs and GaAlAs, said active layer being GaAs and said confining layers being GaAlAs.

16. The semiconductor layer of claim 11 where the materials are combinations of elements selected from the group consisting of In, Ga, Al, As, P, Sb.

17. The semiconductor layer of claim 11 where the internal optical feedback means comprise,
   a periodic grating on a surface of one of said confining layers,
   a plurality of thin horizontal layers of semiconductor material forming a reflector stack disposed adjacent to said p-n junction, said layers having alternating greater and lesser indices of refraction and having thicknesses as to maximize the overall reflectivity of said plurality of thin layers, and
   two parallel facets extending vertically through said active layer.

18. The semiconductor laser of claim 11 the mirror-like surfaces are coated with an insulating window.

19. The semiconductor laser of claim 11 wherein one of said planar, semiconductor layers is a substrate layer, said substrate having spaced apart holes proximate to said mirror-like surfaces for emission of laser radiation therethrough.

20. The semiconductor laser of claim 18 wherein light emitting surfaces delimited by said holes in said substrate are coated with an antireflection coating.

* * * * *